United States Patent
de Larios et al.

[19]

[11] Patent Number: 5,806,126
[45] Date of Patent: Sep. 15, 1998

[54] APPARATUS FOR A BRUSH ASSEMBLY

[75] Inventors: John Martin de Larios, Palo Alto; Mikhail Ravkin, Sunnyvale; Douglas Grant Gardner, Milpitas, all of Calif.

[73] Assignee: OnTrak Systems, Inc., San Jose, Calif.

[21] Appl. No.: 932,292

[22] Filed: Sep. 17, 1997

Related U.S. Application Data

[63] Continuation of Ser. No. 542,531, Oct. 13, 1995, abandoned.

[51] Int. Cl.$^6$ ........................................................ B08B 7/00
[52] U.S. Cl. ................................. 15/102; 15/77; 15/88.3; 134/6; 134/7; 134/26; 134/28; 134/29
[58] Field of Search ...................... 134/2, 3, 6, 7, 134/26, 28, 29; 15/21.1, 77, 88.2, 88.3, 88.4, 97.1, 102, 24

[56] References Cited

U.S. PATENT DOCUMENTS

| | | | |
|---|---|---|---|
| 2,860,354 | 11/1958 | Van Clief, Jr. | 15/21.1 |
| 3,500,490 | 3/1970 | Teren | 15/24 |
| 4,461,052 | 7/1984 | Mostul | 15/24 |
| 4,569,695 | 2/1986 | Yamashita et al. | 134/1 |
| 5,518,552 | 5/1996 | Tanoue et al. | 134/1 |
| 5,639,311 | 6/1997 | Holley et al. | 134/6 |

OTHER PUBLICATIONS

PVA Clean Sponge Material, Rippey Corporation, El Dorado Hills, CA 1992.

PVA Clean Sponge Material, Rippey Corporation, El Dorado Hills, CA 1995.

Post–CMP Cleaning Technology, SEMICON Korea 95, Process Technology, Semiconductor Equipment and Materials International (Jan. 19, 1995), 29–36.

*Primary Examiner*—Zeinab El-Arini
*Attorney, Agent, or Firm*—Blakely, Sokoloff, Taylor & Zafman LLP

[57] ABSTRACT

A Method and Apparatus for Chemical Delivery Through the Brush used in semiconductor substrate cleaning processes. The chemical solutions are delivered to the core of a brush where the solution is absorbed by the brush and then applied by the brush onto the substrate. This delivery system applies the chemical solutions uniformly to the semiconductor substrate, reduces the volumes of chemical solutions used in a scrubbing process, and helps maintain control of the pH profile of a substrate. This system is described and illustrated in the manner it is used in conjunction with a scrubber that scrubs both sides of a semiconductor substrate.

7 Claims, 2 Drawing Sheets

APPARATUS FOR A BRUSH ASSEMBLY

This is a continuation of application Ser. No. 08/542,531, filed Oct. 13, 1995, now abandoned.

BACKGROUND OF THE INVENTION

1. Field of the Invention

This invention relates to methods of processing a substrate, and more specifically, to a method and apparatus for the delivery of chemical solutions during the cleaning process of, for example, semiconductor wafers.

2. Background Information

In the manufacture of semiconductor devices, the surface of semiconductor wafers must be cleaned of wafer contaminants. If not removed, wafer contaminants may affect device performance characteristics and may cause device failure to occur at faster rates than usual.

A scrubber that scrubs a wafer on either one or both sides may be used to remove wafer contaminants. The type of cleaning solution (solution) used in the scrubber may depend upon the type of contaminants to be removed, the particular type of wafer to be scrubbed, and/or the particular manufacturer's preferred method for cleaning. For example, some manufacturers require a low level of contamination and may use a chemical solution for scrubbing, while other manufacturers have a higher contamination tolerance (i.e. less contamination need be removed) and use water for scrubbing.

As the type of solution depends upon manufacturing requirements, similarly, the method or apparatus used to deliver that solution may depend upon the manufacturer's requirements and the type of solution being used. Submersing the wafer in the solution, spraying the solution on the wafer, and dripping the solution on the wafer or the brush are examples of methods used to deliver the solution for scrubbing. The drip delivery system is described in a copending application titled "Drip Chemical Delivery Method and Apparatus," Ser. No. 08/275,785, filed on Jul. 15, 1994, and assigned to the assignee herein. Each of these methods have their advantages and disadvantages.

Submersing the wafer in the solution requires large volumes of chemical solutions. Some of the solutions, for example, $NH_4OH$, can be expensive and dangerous to use. Thus, reducing the volume of solution used is desired.

Spraying the wafer also uses large volumes of solutions. Another disadvantage to spraying is that there is very little control over the chemical composition at the wafer surface. For example, some systems and process may use relatively quick bursts of high pH solutions, such that the pH profile of the surfaces may change rapidly and may not be easily controlled. If the pH profile of the surface is not controlled damage may result to the wafer.

Dripping the solution on the wafer or brush uses smaller volumes of the solution, but may result in nonuniform delivery of the solution. Thus, only the areas of the wafer where the solution was dripped may be cleaned. Also, dripping the solution on the wafer may damage the wafer, depending upon the reactivity of the solution. Some solutions may react as soon as they hit the wafer surface and may cause "grooves" or "holes" to be formed where the solution is dripped onto the wafer. Other solutions, for example $NH_4OH$, do not react as quickly and do not damage the wafer.

Thus, what is needed is a method and apparatus, which may be used in existing scrubbers, that apply the solutions in a manner that allows uniform distribution of the solution and greater control over the pH profile, but that does not use large amounts of chemicals.

SUMMARY OF THE INVENTION

The present invention describes a method and apparatus used in a substrate cleaning system wherein a cleaning solution is applied to a substrate through a brush, such that the cleaning solution is distributed uniformly over the substrate surface.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A Method and Apparatus for Chemical Delivery Through the Brush is disclosed. In the following description, numerous specific details are set forth such as specific materials, process steps, process parameters, solutions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention may be employed in a number of substrate cleaning procedures. Although the present invention is described in conjunction with the scrubbing of a wafer, it will be appreciated that any similarly shaped, i.e. generally flat substrate, may be processed by the methods and apparatus of the present invention. Further, it will be appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) device, or substrates for processing other apparati and devices such as flat panel displays, multichip modules, etc. However, to avoid obscuring the invention the following description will describe wafer cleaning in general and as an example of a preferred embodiment will describe the use of the present invention in a scrubbing process.

Overview of the Scrubbing Process

As an example, and not by limitation, the present invention is described in conjunction with a scrubbing process, more specifically, a scrubbing process in which both sides of the wafer are scrubbed. The scrubber includes a number of stations. Each of these stations represents one or more steps in the substrate cleaning process. Contaminated substrates are loaded at one end of the system and cleaned and dried substrates are unloaded from the other end of the system. An example of a system of this type is the DSS-200™ scrubber available from OnTrak Systems, Inc. of Milpitas, Calif.

Figure 1:
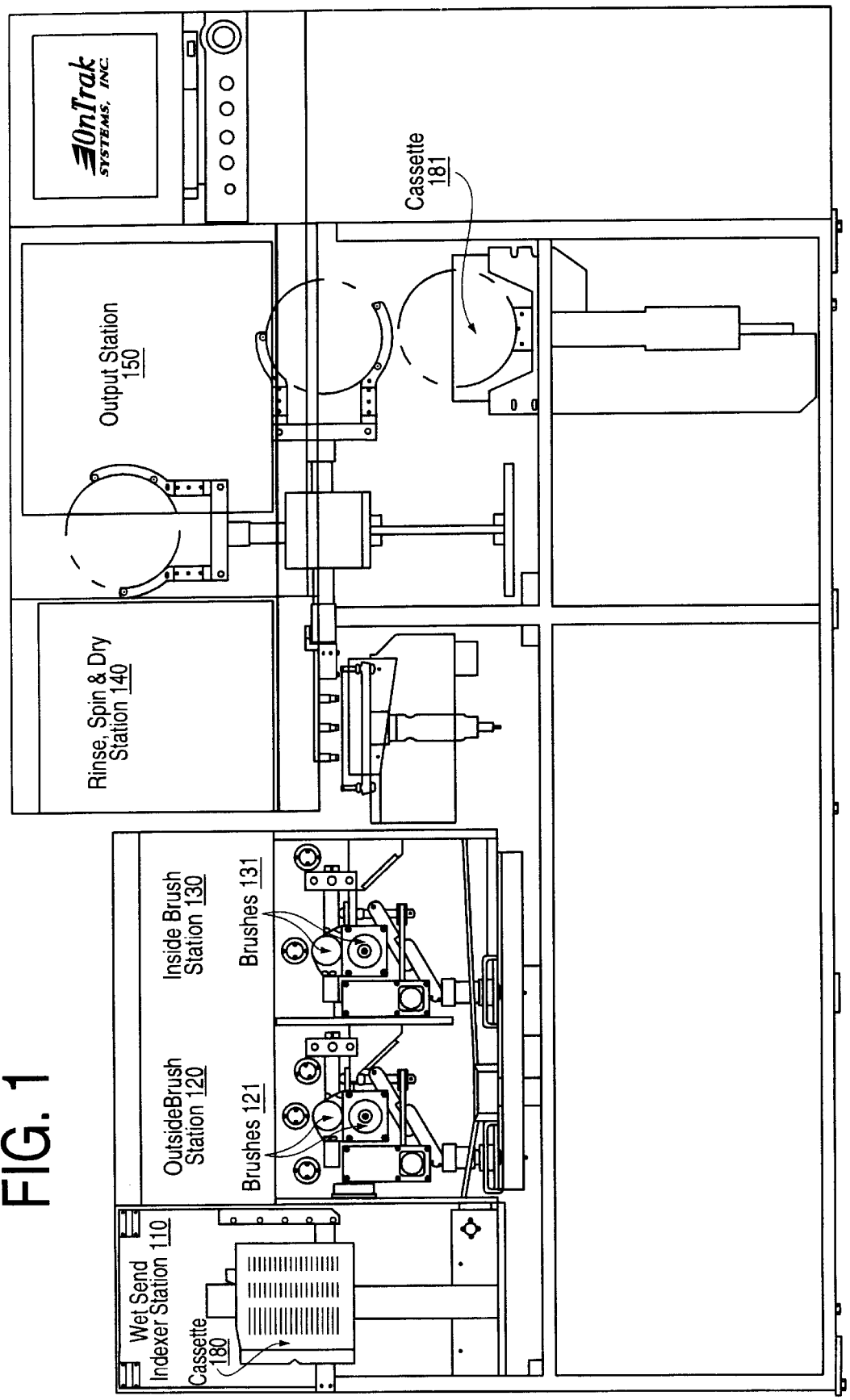
FIG. 1 represents a cross sectional view of a DSS-200™ system configuration.

FIG. 1 represents a cross sectional view of a DSS-200™ configuration (cleaning system). Usually, the contaminated substrates are delivered to the cleaning system after chemical mechanical polishing (CMP), from a wet bench, or from other processes resulting in contamination. At the start of the cleaning process contaminated substrates are loaded into a wafer cassette 180 (cassette) and the cassette 180 is then placed into the wet send indexer station 110. After cassette 180 is placed into wet send indexer station 110 the substrates are automatically removed from the cassette 180 and placed, one at a time, into the outside brush station 120.

In the outside brush station 120 a substrate is processed through a first scrub. In a currently preferred embodiment, the substrate is treated with an ammonium hydroxide ($NH_4OH$) solution during the first scrub. The $NH_4OH$ solution is applied to the substrate through brushes 121. Delivery of the $NH_4OH$ chemical solution through the brushes is discussed in detail below, following the overview of the scrub process.

The scrubbed substrate is then automatically removed from the outside brush station 120 and placed into the inside brush station 130. In the inside brush station 130, the substrate is processed through a second scrub. In a currently preferred embodiment, the substrate is treated with an hydrogen fluoride (HF) solution during the second scrub. As in the first scrub step, the HF solution is applied to the substrate through brushes 131. Delivery of the HF chemical solution through the brushes is also discussed in detail below, following the overview of the scrub process.

After the second scrub the substrate is then automatically removed from the inside brush station 130 and placed into the rinse, spin and dry station 140. Rinse, spin, and dry station 140 rinses, spins, and dries the substrate. At this point the wafer has been cleaned.

Once the rinse, spin, and dry steps have been completed the substrate is then transported from the rinse, spin, and dry station 140 to the output station 150 where the substrate will be placed into cassette 181. The transfer is usually carried out by a robotic arm which lifts the substrate out of the rinse, spin, and dry station 140 by its edges and places it into the cassette 181. The cassette is then transferred to storage or to another cleaning or processing system.

It will be clear to one of ordinary skill in the art that some of the steps in the cleaning system described above may occur in another order or with different solutions other than as presented. For example, the ammonium hydroxide and hydrogen fluoride solutions used in the brush stations 120 and 130, respectively, may be reversed. As another example, different solutions, such as water, citric acid, and ammonium citrate may be used in place of the ammonium hydroxide or hydrogen fluoride solutions.

It should be noted that while the following description illustrates the use of the present invention in a cleaning system in which both sides of the substrate are scrubbed, the present invention may be used in other cleaning systems and processes. For example, a cleaning system in which only a single side of the substrate is scrubbed.

Chemical Solution Delivery Systems

As referred to above in the discussion of the brush stations, a chemical delivery system that applies the chemical solution to the substrate through the brushes may be employed. The particular delivery system used may depend upon what chemical solution is being used and the desired concentration of the solution. Two types of systems are described below: one where a high concentration of a chemical is delivered to the brush and then diluted and another where a lower concentration of a chemical (i.e. an already dilute chemical solution) is delivered to the brush.

Figure 2:
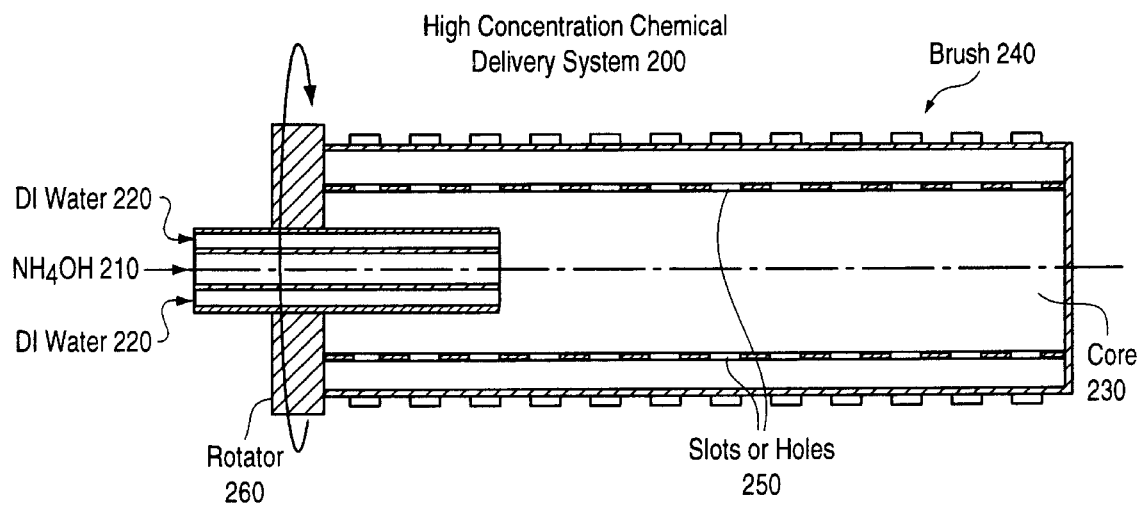
FIG. 2 illustrates a currently preferred embodiment of a high concentration chemical delivery system.

The first system to be described is a chemical delivery system through a brush where a high concentration of a chemical is delivered directly to the brush and is then diluted by the delivery of water (high concentration chemical delivery system). A currently preferred embodiment of high concentration chemical delivery system is illustrated in FIG. 2. As an example, the high concentration chemical delivery system is described below in conjunction with the delivery of ammonium hydroxide ($NH_4OH$). It will be obvious to one with ordinary skill in the art that other chemicals may be used in conjunction with the described system.

$NH_4OH$ is used to change the zeta potential between the surface of the substrate and the contaminants. The zeta potential is related to the surface energy or "charge" at the surface of the substrate and contaminants. $NH_4OH$ changes the zeta potential such that the contaminants and substrate surface have potentials which are of like charges and thus repel one another.

In a currently preferred embodiment of the high concentration chemical delivery system 200 there are two separate delivery tubes: one tube for delivering a chemical, for example $NH_4OH$, (i.e. delivery tube 210) and another tube for delivering water, for example deionized water (i.e. delivery tube 220). Providing separate delivery tubes for the chemical, $NH_4OH$, and the water allows the flow rate of the $NH_4OH$ to be controlled separately from the flow rate of the deionized water. In one currently preferred embodiment the flow rate of deionized water ranges from approximately 0.5 to 1 liter per minute, and the flow rate of $NH_4OH$ ranges from approximately 50 to 500 milliliters per minute at concentrations in the range of approximately 0.5 to 29 percent. Because the two delivery tubes are separate the deionized water may flow constantly through the brush while scrubbing and then the $NH_4OH$ may be turned on or off as needed to control the zeta potential of the substrate. It should be noted and it will be obvious to one with ordinary skill in the art, however, that either delivery tube may be turned on or off at any time and also that other flow rates and concentrations may be used as desired by a particular user.

Referring to FIG. 2, delivery tube 210 is located inside delivery tube 220. It will be obvious to one with ordinary skill in the art that other arrangements for the setup of the delivery tubes may be used, for example, the tubes may be located side by side rather than one inside the other. In another embodiment of delivery system 200 a baffle is placed on the end of delivery tube 210 so that the $NH_4OH$ does not shoot out of the delivery tube in a stream. It should also be noted that it will be obvious to one with ordinary skill in the art that the size of the delivery tubes may vary according to the desired concentrations, volumes, and flow rates for the particular cleaning process.

As shown in FIG. 2, delivery tubes 210 and 220 deliver the $NH_4OH$ and deionized water, respectfully, into hollow core 230 of brush 240 in delivery system 200. The $NH_4OH$ and deionized water are mixed thoroughly in hollow core 230 so that the chemical solution may be distributed in uniform concentrations to the brush. It will be obvious to one with ordinary skill in the art that hollow core 230 may be comprised of a simple space, tubing, channels, pockets, etc.

The brush 240 may generally be selected from two types of brushes: bristle and sponge brushes. In a currently preferred embodiment of the present invention, Polyvinyl Alcohol (PVA) sponge brushes are used. The chemical solution ($NH_4OH$ solution) is distributed to the brushes such that the brushes are evenly soaked (or saturated) with the $NH_4OH$ solution. In the currently preferred embodiment illustrated in FIG. 2 the brushes are saturated with the NH₄OH solution by absorbing the solution through the slots (or holes) 250 in the outer rim of hollow core 230. It will be obvious to one with ordinary skill in the art that other implementations and devices may be used to evenly soak the brushes, for example, baffles or channels may be used.

As brush 240 is being saturated with the NH₄OH solution it is rotated by rotation device 260. Rotation device 260 turns brush 240 in a clockwise (or counterclockwise) manner, thereby applying the NH₄OH solution to the substrate while scrubbing the substrate to remove contaminants. Because brush 240 is saturated with the NH₄OH solution the solution is uniformly applied to the substrate. Uniform distribution of a chemical solution is essential to control the pH level on the substrate surface. Nonuniform distribution of the chemical solution can cause poor or reduced contamination removal in localized areas on the substrate surface.

After the substrate has been scrubbed the substrate may then be rinsed with water. In a currently preferred embodiment, the substrate is rinsed by turning off delivery tube 210 so that the flow of NH₄OH is cut off and only deionized water is being delivered into hollow core 230. After delivery tube 210 is turned off, the NH₄OH solution dissipates and gradually lowers the pH level on the surface of the substrate for the duration of the scrub. Hence, not only does the chemical delivery system 200 apply the chemical solution uniformly, but delivery system 200 also maintains control of the pH level on the substrate. It should be noted that the substrate may also be rinsed by spraying; however, rinsing with the deionized water delivery through the brush not only rinses the substrate but also rinses the remaining NH₄OH solution out of brush 240. Depending upon the type of chemical being used rinsing brush 240 may extend the useful lifetime of the brush and may also be useful in preparing the scrubbing system so that other chemicals may be substituted for the NH₄OH.

Figure 3:
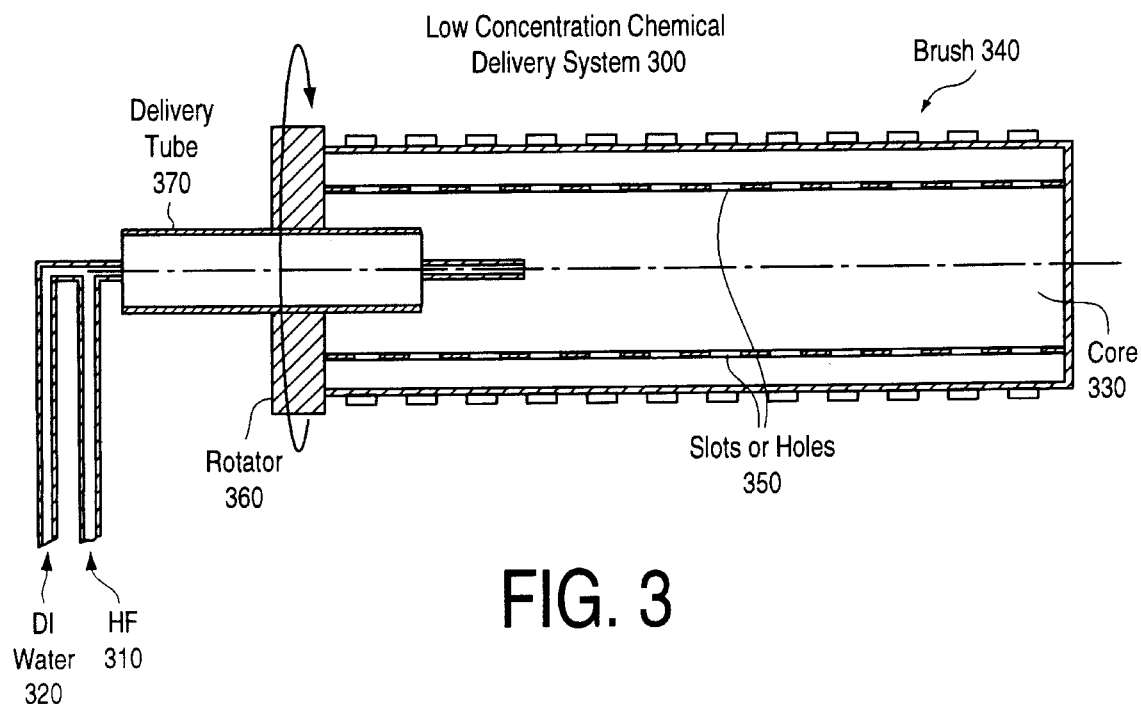
FIG. 3 illustrates a currently preferred embodiment of a low concentration chemical delivery system.

As stated above the particular delivery system used may depend upon what type of chemical solution is being used and the desired level of concentration of that solution. The second system to be described is a chemical delivery system through a brush where a low concentration of a chemical is delivered to a brush (low concentration chemical delivery system). A currently preferred embodiment of a low concentration chemical delivery system is illustrated in FIG. 3. As an example, the low concentration chemical delivery system is described below in conjunction with the delivery of hydrogen fluoride (HF). It will be obvious to one with ordinary skill in the art that other chemicals may be used in conjunction with the described system.

HF is used to remove a thin layer of oxide from the substrate surface. During chemical mechanical polishing a substrate may develop microcracks in an oxide layer. In these microcracks small deposits of materials, such as potassium and sodium, build up. In order to remove these microcracks (and the material deposits that have been built up inside them) a short etch to remove a thin coating of the oxide layer is performed. Scrubbing the substrate with an HF solution is one method of performing such an etch. The substrate is scrubbed in an HF solution until approximately 25 Å to approximately 250 Å of the oxide layer is removed, thus removing the materials deposited in the microcracks. In one currently preferred embodiment the substrate is scrubbed in an HF solution until approximately 100 Å of the oxide layer is removed.

Because HF reacts very quickly with the substrate surface it is preferable to use an HF solution with a lower concentration, but in high volumes. An HF solution with a concentration in the range of approximately 0.25 percent to approximately 2 percent may be applied to the substrate. In one currently preferred embodiment an HF solution with a concentration of approximately 100:1 H₂O:HF.

In a currently preferred embodiment of the low concentration chemical delivery system 300, the premixed HF solution and water are sequentially supplied through supply lines 310 and 320, respectively. Also in the currently preferred embodiment described above, supply line 320 supplies the necessary amounts of water, for example deionized water, to the brush in order to keep the brush and substrate moist during the scrubbing process. When it is desired to perform the etch, supply line 320, which delivers water, is turned off and supply line 310, which delivers the HF solution, is turned on. After a predetermined amount of time or after a satisfactory etch has been performed, HF supply line 310 is turned off and water supply line 320 is turned back on.

Supply lines 310 and 320 run into delivery tube 370. Delivery tube 370 then delivers the HF solution or the deionized water into hollow core 330 of brush 340 at a predetermined flow rate. The flow rate for HF may be in the range of approximately 0.2 to approximately 0.7 liters per minute and the flow rate for deionized water may be in the range of approximately 0.5 to approximately 1 liter per minute. It will be obvious to one with ordinary skill in the art that other arrangements may be used to supply the HF solution and deionized water, for example, the delivery tubes 210 and 220 as described with respect to the high concentration chemical delivery system above may be used, provided the specific flow rates for each chemical or solution are set appropriately, etc.

As with the high concentration chemical delivery system described above, the brush 340 of the low concentration chemical delivery system may generally be selected from two types of brushes: bristle and sponge brushes. In a currently preferred embodiment of the present invention, PVA sponge brushes are used. During the etch, the chemical solution (HF solution) is distributed to the brushes such that the brushes are evenly soaked (or saturated) with the HF solution. In the currently preferred embodiment illustrated in FIG. 3 the brushes are saturated with the HF solution by absorbing the solution through the slots (or holes) 350 in the outer rim of hollow core 330. It will be obvious to one with ordinary skill in the art that other implementations and devices may be used to evenly soak the brushes, for example, baffles or channels may be used.

As brush 340 is being saturated with the HF solution it is rotated by rotation device 360. Rotation device 360 turns brush 340 in a clockwise (or counterclockwise) manner, thereby applying the HF solution to the substrate. Because brush 340 is saturated with the HF solution, the solution is uniformly applied to the substrate. Thus, the substrate is uniformly etched to remove the contaminant filled microcracks of the oxide layer.

The HF solution is only applied until the desired amount of the oxide layer is removed, for example, in the above mentioned preferred embodiment until approximately 100 Å is removed. Once the desired level is reached the etch must be stopped. To stop the etch HF supply line 310 is turned off and water supply line 320 is turned back on. After supply line 310 is turned off, the HF solution dissipates and the brush and substrate are rinsed with only deionized water, thus stopping the etch.

It should be noted and it will be obvious to one with ordinary skill in the art, that other methods for rinsing the brush and substrate, for example spraying with deionized water, are also available. It should also be noted that although the present invention is described above with respect to NH$_4$OH and HF solutions, the present invention may also be practiced with other chemical solutions, for example, citric acid, ammonium citrate, hydrogen chloride, chelating agents, surfactants, chemical mixtures, etc. Additionally, it will be obvious to one with ordinary skill in the art that the low concentration and high concentration delivery systems may be used in either brush station one or brush station two or the same delivery system may be used in both brush stations.

The above described chemical delivery systems (i.e. chemical delivery through the brush) apply chemical solutions in a uniform manner to the semiconductor substrate, reduce the volumes of chemical solutions used in a scrubbing process, and help maintain control of the pH profile of a substrate during scrubbing.

Thus, a Method and Apparatus for Chemical Delivery Through the Brush has been described. Although specific embodiments, including specific equipment, process steps, process parameters, materials, solutions, and etc. have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. An apparatus for a brush assembly comprising:

a brush for scrubbing a semiconductor substrate, wherein said brush has a core, said core having a space therein;

a rotation device, wherein said rotation device rotates said brush; and a solution delivery system, said solution delivery system disposed to deliver a solution to said space in said core, said solution delivery system having:

a first delivery tube, wherein said first delivery tube delivers a first solution at a first flow rate;

a second delivery tube, wherein said second delivery tube delivers a second solution at a second flow rate;

a first device for controlling the first flow rate of said first delivery tube; and a second device for controlling the second flow rate of said second delivery tube.

2. The apparatus as described in claim 1 wherein said brush is a PVA brush.

3. The apparatus as described in claim 1 wherein said first solution is NH$_4$OH and said second solution is deionized water.

4. The apparatus as described in claim 1 wherein said first delivery tube is located inside said second delivery tube.

5. An apparatus for a brush assembly comprising:

a brush for scrubbing a semiconductor substrate, wherein said brush has a core, said core having a space therein;

a rotation device, wherein said rotation device rotates said brush; and a solution delivery system, said solution delivery system disposed to deliver a solution to said space in said core, said solution delivery system having:

a first supply line, wherein said first supply line supplies a first solution;

a second supply line, wherein said second supply line supplies a second solution;

a delivery tube, wherein said first supply line and said second supply line are connected to said delivery tube; and a device for controlling the flow rate of said delivery tube.

6. The apparatus as described in claim 5 wherein said brush is a PVA brush.

7. The apparatus as described in claim 5 wherein said first solution is HF and said second solution is deionized water.

* * * * *